United States Patent
Choi et al.

(10) Patent No.: US 12,046,700 B2
(45) Date of Patent: Jul. 23, 2024

(54) NANOROD LIGHT EMITTING DEVICE AND METHOD OF MANUFACTURING THE SAME

(71) Applicant: SAMSUNG ELECTRONICS CO., LTD., Suwon-si (KR)

(72) Inventors: Junhee Choi, Seongnam-si (KR); Nakhyun Kim, Yongin-si (KR); Jinjoo Park, Yongin-si (KR); Joohun Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/238,390

(22) Filed: Aug. 25, 2023

(65) Prior Publication Data
US 2023/0402569 A1    Dec. 14, 2023

Related U.S. Application Data

(63) Continuation of application No. 17/112,346, filed on Dec. 4, 2020, now Pat. No. 11,777,056.

(30) Foreign Application Priority Data

Jun. 18, 2020  (KR) .......................... 10-2020-0074444

(51) Int. Cl.
*H01L 33/24*   (2010.01)
*H01L 27/15*   (2006.01)
(Continued)

(52) U.S. Cl.
CPC ............ *H01L 33/24* (2013.01); *H01L 27/156* (2013.01); *H01L 33/0025* (2013.01);
(Continued)

(58) Field of Classification Search
CPC ....................................................... H01L 33/06
See application file for complete search history.

(56) References Cited

U.S. PATENT DOCUMENTS

| 8,835,903 B2 | 9/2014 | Gwo et al. |
| 9,385,337 B2 | 7/2016 | Pan |

(Continued)

FOREIGN PATENT DOCUMENTS

| KR | 10-2019-0099055 A | 8/2019 |
| KR | 10-2019-0138719 A | 12/2019 |

OTHER PUBLICATIONS

Communication dated Jun. 4, 2021, from the European Patent Office in European Application No. 20214186.7.
(Continued)

*Primary Examiner* — Moazzam Hossain
*Assistant Examiner* — Hajar Kolahdouzan
(74) *Attorney, Agent, or Firm* — Sughrue Mion, PLLC

(57) ABSTRACT

Provided is a nanorod light-emitting device including a first semiconductor layer doped with a first conductive type impurity, an emission layer disposed above the first semiconductor layer, a second semiconductor layer disposed above the emission layer and doped with a second conductive type impurity that is electrically opposite to the first conductive type impurity, a conductive layer disposed between at least one of a center portion of a lower surface of the emission layer and the first semiconductor layer and a center portion of an upper surface of the emission layer and the second semiconductor layer, and a current blocking layer surrounding a sidewall of the conductive layer.

20 Claims, 22 Drawing Sheets

(51) Int. Cl.
*H01L 33/00* (2010.01)
*H01L 33/06* (2010.01)
*H01L 33/14* (2010.01)
*H01L 33/30* (2010.01)
*H01L 33/40* (2010.01)

(52) U.S. Cl.
CPC .......... *H01L 33/0062* (2013.01); *H01L 33/06* (2013.01); *H01L 33/145* (2013.01); *H01L 33/30* (2013.01); *H01L 33/40* (2013.01)

(56) References Cited

U.S. PATENT DOCUMENTS

| | | |
|---|---|---|
| 2003/0173571 A1 | 9/2003 | Kish, Jr. et al. |
| 2012/0223289 A1 | 9/2012 | Gwo et al. |
| 2015/0037203 A1 | 2/2015 | Pan |
| 2017/0170360 A1* | 6/2017 | Bour .................. H01L 33/145 |
| 2018/0204977 A1 | 7/2018 | Dheeraj et al. |
| 2019/0319066 A1 | 10/2019 | Tan et al. |
| 2019/0355868 A1 | 11/2019 | Fimland et al. |
| 2019/0371965 A1 | 12/2019 | Na et al. |

OTHER PUBLICATIONS

Suarez, I. et al., "Optimal control of AlAs oxidation via digital alloy heterostructure compositions", Journal of Physics D: Applied Physics, vol. 42, Aug. 17, 2009. (11 pages total).

Zhang, Jianwei et al., "High-peak-power vertical-cavity surface-emitting laser quasi-array realized using optimized large-aperture single emitters", Japanese Journal of Applied Physics, vol. 53, Issue 070303, Jun. 11, 2014. (4 pages total).

* cited by examiner

NANOROD LIGHT EMITTING DEVICE AND METHOD OF MANUFACTURING THE SAME

CROSS-REFERENCE TO RELATED APPLICATION

This application is a continuation of U.S. application Ser. No. 17/112,346, filed Dec. 4, 2020, which claims priority to Korean Patent Application No. 10-2020-0074444, filed on Jun. 18, 2020, in the Korean Intellectual Property Office, the disclosure of which is incorporated herein in its entirety by reference.

BACKGROUND

1. Field

Example embodiments of the present disclosure relate to a nanorod light-emitting device and a method of manufacturing the same, and more particularly, to a nanorod light-emitting device having a centralized current passage structure that prevents a current from flowing to a surface of a nanorod and allows a current to flow to a center portion of the nanorod and a method of manufacturing the nanorod light-emitting device. Furthermore, example embodiments of the present disclosure relate to a display apparatus including a nanorod light-emitting device.

2. Description of Related Art

A light-emitting diode (LED) is known as a next-generation light source having a long lifespan, low power consumption, short response time, and environment friendliness compared to other light sources. Due to such advantages, the industrial demand for LEDs has increased. LEDs are applied and used in various products such as lighting apparatuses, backlights of display apparatuses, and the like.

Recently, microscale or nanoscale LEDs including group II-VI or group III-V compound semiconductors have been developed. Furthermore, micro LED displays including display pixels in which such small LEDs are used as light-emitting elements have been developed. However, when the size of an LED is decreased to a microscale or nanoscale size, the luminous efficiency of the LED may decrease due to a surface defect.

SUMMARY

One or more example embodiments provide a nanorod light-emitting device and a method of manufacturing the same, and more particularly, a nanorod light-emitting device having a centralized current passage structure that prevents a current from flowing to a surface of a nanorod and allows a current to flow to a center portion of the nanorod and a method of manufacturing the nanorod light-emitting device.

One or more example embodiments also provide a display apparatus including a nanorod light-emitting device.

Additional aspects will be set forth in part in the description which follows and, in part, will be apparent from the description, or may be learned by practice of example embodiments of the disclosure.

According to an aspect of an example embodiment, there is provided a nanorod light-emitting device including a first semiconductor layer doped with a first conductive type impurity, an emission layer disposed above the first semiconductor layer, a second semiconductor layer disposed above the emission layer and doped with a second conductive type impurity that is electrically opposite to the first conductive type impurity, a conductive layer disposed between at least one of a center portion of a lower surface of the emission layer and the first semiconductor layer and a center portion of an upper surface of the emission layer and the second semiconductor layer, and a current blocking layer surrounding a sidewall of the conductive layer.

The first semiconductor layer may be a single layer including a semiconductor material with a single composition.

The second semiconductor layer may be a single layer including a semiconductor material with a single composition which is same as the semiconductor material of the first semiconductor layer.

The current blocking layer may include an oxide material.

The conductive layer may include a first conductive layer disposed between the center portion of the lower surface of the emission layer and the first semiconductor layer, and a second conductive layer disposed between the center portion of the upper surface of the emission layer and the second semiconductor layer.

The current blocking layer may include a first current blocking layer surrounding a sidewall of the first conductive layer between the lower surface of the emission layer and the first semiconductor layer, and a second current blocking layer surrounding a sidewall of the second conductive layer between the upper surface of the emission layer and the second semiconductor layer.

The emission layer may include a first quantum well structure and a second quantum well structure, wherein the conductive layer further includes a third conductive layer disposed in a center portion between the first quantum well structure and the second quantum well structure, and wherein the current blocking layer further includes a third current blocking layer surrounding a sidewall of the third conductive layer and provided between the first quantum well structure and the second quantum well structure.

A diameter of the first semiconductor layer, a diameter of the current blocking layer, a diameter of the emission layer, and a diameter of the second semiconductor layer may be equal to one another.

An outer diameter of the current blocking layer may range from 0.05 µm to 2 µm.

A diameter of the conductive layer may be greater than or equal to 0.01 µm and may be less than the outer diameter of the current blocking layer.

A height of the nanorod light-emitting device may range from 1 µm to 20 µm.

A thickness of the current blocking layer may be equal to a thickness of the conductive layer.

The thickness of the current blocking layer may range from 5 nm to 200 nm.

The conductive layer may include $Al_xGa_{1-x}As$, where x satisfies x≥0.85, the current blocking layer includes AlOx, and the first semiconductor layer and the second semiconductor layer each include AlGaInP.

The nanorod light-emitting device may further include a passivation film surrounding side surfaces of the first semiconductor layer, the current blocking layer, the emission layer, and the second semiconductor layer.

The passivation film may include at least one material selected from among AlOx, HfOx, TiOx, SiNx, SiOx, and $Al_xGa_{1-x}As$, where x satisfies x≥0.9.

The passivation film may include a material having an epitaxial relationship with the emission layer to form a hetero junction at an interface between the passivation film and the emission layer.

The current blocking layer, the emission layer, and the second semiconductor layer may have a same first diameter, and the first semiconductor layer may have a second diameter that is larger than the first diameter.

According to another aspect of an example embodiment, there is provided a display apparatus including a plurality of pixel electrodes, a common electrode corresponding to the plurality of pixel electrodes, and a plurality of nanorod light-emitting devices connected between each pixel electrode and the common electrode, wherein each nanorod light-emitting device includes a first semiconductor layer doped with a first conductive type impurity, an emission layer disposed above the first semiconductor layer, a second semiconductor layer disposed above the emission layer and doped with a second conductive type impurity that is electrically opposite to the first conductive type impurity, a conductive layer disposed between at least one of a center portion of a lower surface of the emission layer and the first semiconductor layer or a center portion of an upper surface of the emission layer and the second semiconductor layer, and a current blocking layer surrounding a sidewall of the conductive layer.

According to another aspect of an example embodiment, there is provided a method of manufacturing a nanorod light-emitting device, the method including forming a sacrificial layer on a semiconductor substrate, forming a first semiconductor layer doped with a first conductive type impurity on the sacrificial layer, forming an emission layer above the first semiconductor layer, forming, above the emission layer, a second semiconductor layer doped with a second conductive type impurity that is electrically opposite to the first conductive type, forming a conductive layer material on the first semiconductor layer between the forming of the first semiconductor layer and the forming of the emission layer or forming a conductive layer on the emission layer between the forming of the emission layer and the forming of the second semiconductor layer, forming a plurality of nanorod light-emitting devices by partially etching the first semiconductor layer, the emission layer, the second semiconductor layer, and the conductive layer, and forming a current blocking layer surrounding a sidewall of the conductive layer by oxidizing the sidewall of the conductive layer through an oxidization process.

The first semiconductor layer may include a semiconductor material with a single composition, and the second semiconductor layer may include a semiconductor material with a single composition which is same as the semiconductor material of the first semiconductor layer.

A diameter of the first semiconductor layer, a diameter of the current blocking layer, a diameter of the emission layer, and a diameter of the second semiconductor layer may be equal to one another.

An outer diameter of the current blocking layer may range from 0.05 μm to 2 μm.

A diameter of the conductive layer may be greater than or equal to 0.01 μm and may be less than the outer diameter of the current blocking layer.

A height of the nanorod light-emitting device may range from 1 μm to 20 μm.

A thickness of the current blocking layer may range from 5 nm to 200 nm.

The conductive layer may include $Al_xGa_{1-x}As$, where x satisfies x≥0.85, the current blocking layer may include AlOx, and the first semiconductor layer and the second semiconductor layer may each include AlGaInP.

The method may further include forming a passivation film surrounding side surfaces of the first semiconductor layer, the current blocking layer, the emission layer, and the second semiconductor layer.

The passivation film may include at least one material selected from among AlOx, HfOx, TiOx, SiNx, SiOx, and $Al_xGa_{1-x}As$, where x satisfies x≥0.9.

The passivation film may include a material having an epitaxial relationship with the emission layer to form a hetero junction in an interface between the passivation film and the emission layer.

The plurality of nanorod light-emitting devices may be separated from one another by removing the sacrificial layer.

The nanorod light-emitting device may further include a passivation film surrounding side surfaces of the current blocking layer and the emission layer.

According to another aspect of an example embodiment, there is provided a nanorod light-emitting device including a first semiconductor layer doped with a first conductive type impurity, an emission layer disposed above the first semiconductor layer, a second semiconductor layer disposed above the emission layer and doped with a second conductive type impurity that is electrically opposite to the first conductive type impurity, a first conductive layer disposed between a center portion of a lower surface of the emission layer and the first semiconductor layer, a first current blocking layer surrounding a sidewall of the first conductive layer, a second conductive layer disposed between a center portion of an upper surface of the emission layer and the second semiconductor layer, a second current blocking layer surrounding a sidewall of the second conductive layer, wherein the first conductive layer and the second conductive layer each include $Al_xGa_{1-x}As$, where x satisfies x≥0.85, the first current blocking layer and the second current blocking layer each include AlOx, and the first semiconductor layer and the second semiconductor layer each include AlGaInP.

The nanorod light-emitting device may further include a passivation film surrounding side surfaces of the current blocking layer and the emission layer.

BRIEF DESCRIPTION OF THE DRAWINGS

The above and/or other aspects, features, and advantages of example embodiments of the disclosure will be more apparent from the following description taken in conjunction with the accompanying drawings, in which.

DETAILED DESCRIPTION

Figure 1:
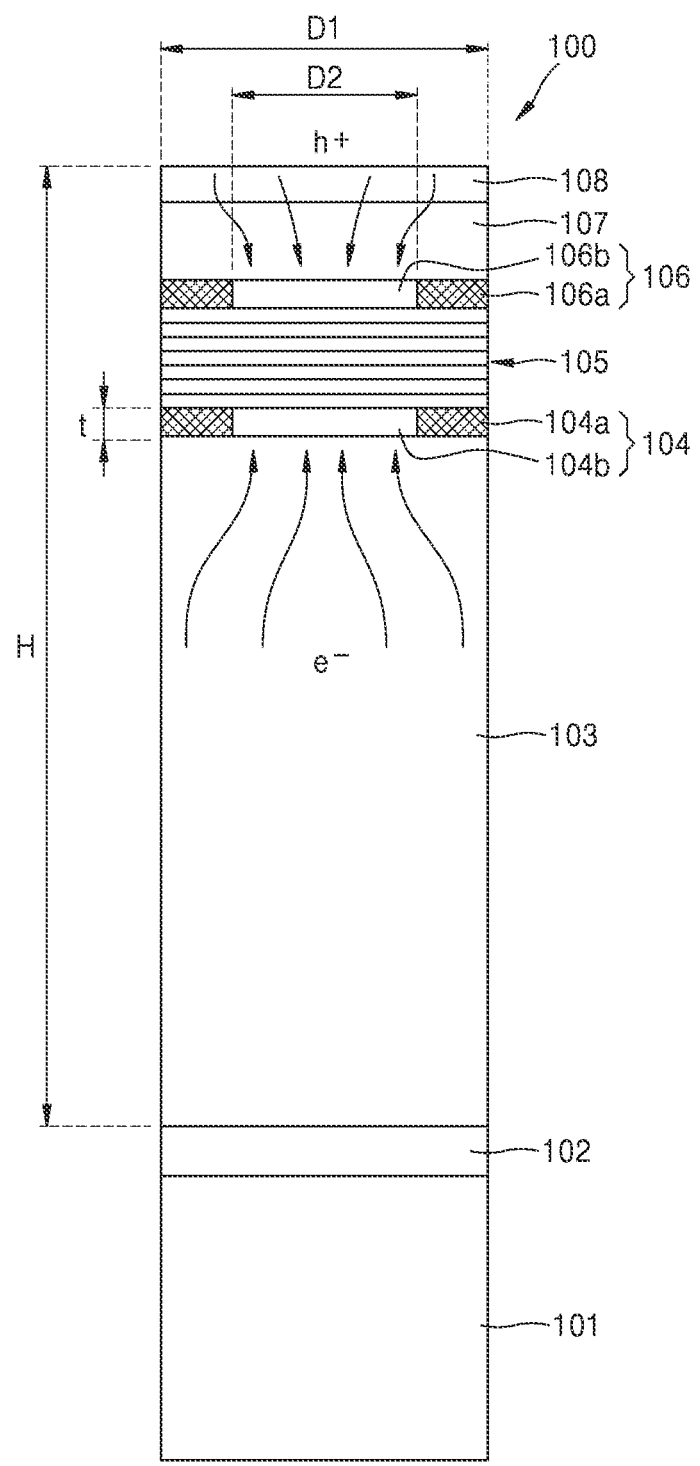
FIG. 1 is a cross-sectional view illustrating a schematic configuration of a nanorod light-emitting device according to an example embodiment.

Reference will now be made in detail to example embodiments of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, a nanorod light-emitting device having a centralized current passage structure and a method of manufacturing the same will be described in detail with reference to the accompanying drawings. In the drawings, like reference numerals refer to the like elements throughout, and sizes of elements may be exaggerated for clarity. The embodiments described below are just examples and various modifications can be made thereto.

When an element is referred to as being "on" another element, it may be directly on the other element in contact with the other element or may be on the other element without contacting the other element. As used herein, the singular forms are intended to include the plural forms as well, unless the context clearly indicates otherwise. When it is mentioned that a certain part "includes" or "comprises" certain elements, the part may further include other elements, unless otherwise specified.

The term "the" or "said" and other similar demonstrative terms may correspond to both singular and plural forms. The order of individual steps included in a method does not imply that the steps should be performed in this order; rather, the steps may be performed in any suitable order, unless expressly indicated otherwise.

The term " . . . unit" or "module" denotes a unit for processing at least one function or operation, and may be implemented as hardware or software or a combination thereof.

Line connections or connection members between elements illustrated in the drawings exemplarily represent functional connections and/or physical or circuit connections, and in actual applications, they may be replaced or embodied as various additional functional connections, physical connections, or circuit connections.

All examples or terms indicative of examples used herein are merely for describing the technical concept, and the scope of the present disclosure is not limited due to such examples or terms indicative of examples unless the scope is limited by the claims.

FIG. 1 is a cross-sectional view illustrating a schematic configuration of a nanorod light-emitting device according to an example embodiment. Referring to FIG. 1, a nanorod light-emitting device 100 may include a first semiconductor layer 103, an emission layer 105 arranged above the first semiconductor layer 103, a second semiconductor layer 107 arranged above the emission layer 105, a first current passage layer 104 arranged between the first semiconductor layer 103 and the emission layer 105, and a second current passage layer 106 arranged between the emission layer 105 and the second semiconductor layer 107.

The first semiconductor layer 103 may be arranged above a substrate 101, and a buffer layer or sacrificial layer 102 may be further arranged between the substrate 101 and the first semiconductor layer 103. For example, the sacrificial layer 102 may be arranged on the substrate 101, and the first semiconductor layer 103 may be arranged on the sacrificial layer 102. The substrate 101 may include a group II-VI or group III-V compound semiconductor material. For example, the substrate 101 may include gallium arsenide (GaAs). The nanorod light-emitting device 100 may be used in a state in which the substrate 101 and the sacrificial layer 102 are included, or may also be used in a state in which the substrate 101 and the sacrificial layer 102 are removed after the nanorod light-emitting device 100 is manufactured.

The first semiconductor layer 103 and the second semiconductor layer 107 may include a group II-VI or group III-V compound semiconductor material. The first semiconductor layer 103 and the second semiconductor layer 107 provide electrons and holes to the emission layer 105. To this end, the first semiconductor layer 103 may be doped as an n type or p type, and the second semiconductor layer 107 may be doped as a conductive type which is electrically opposite to that of the first semiconductor layer 103. For example, the first semiconductor layer 103 may be doped as an n type and the second semiconductor layer 107 may be doped as a p type, or the first semiconductor layer 103 may be doped as a p type and the second semiconductor layer 107 may be doped as an n type. When the first semiconductor layer 103 or the second semiconductor layer 107 is doped as an n type, for example, silicon (Si) may be used as a dopant, and, when the first semiconductor layer 103 or the second semiconductor layer 107 is doped as a p type, for example, zinc (Zn) may be used as a dopant. The first semiconductor layer 103 or the second semiconductor layer 107 doped as an n type may provide electrons to the emission layer 105, and the second semiconductor layer 107 or the first semiconductor layer 103 doped as a p type may provide holes to the emission layer 105.

The substrate 101 and the sacrificial layer 102 may be doped as the same conductive type as the first semiconductor layer 103 arranged thereon. For example, when the first semiconductor layer 103 is doped as an n type, the substrate 101 and the sacrificial layer 102 may include n-GaAs. The substrate 101 may be doped at a lower concentration than that of the sacrificial layer 102, and the sacrificial layer 102 may be doped at a higher concentration than that of the substrate 101. A contact layer for an ohmic contact may be further arranged between the first semiconductor layer 103 and the sacrificial layer 102. The contact layer arranged between the first semiconductor layer 103 and the sacrificial layer 102 may be doped as the same conductive type as that of the first semiconductor layer 103, and may be doped at a higher concentration than that of the first semiconductor layer 103 and the sacrificial layer 102.

The emission layer 105 has a structure in which a quantum well is arranged between walls. The electrons and holes provided from the first semiconductor layer 103 and the second semiconductor layer 107 may be recombined within the quantum well in the emission layer 105, thereby generating light. A wavelength of the light generated in the emission layer 105 may be determined according to a bandgap of a material included in the quantum well in the emission layer 105. The emission layer 105 may have only one quantum well, but may also have a multi-quantum well (MQW) structure in which a plurality of quantum wells and a plurality of walls are alternately arranged. A thickness of the emission layer 105 or the number of quantum wells in the emission layer 105 may be appropriately selected in consideration of a driving voltage and luminous efficiency of the nanorod light-emitting device 100. For example, the thickness of the emission layer 105 may be selected to be at most two times an outer diameter D1 of the nanorod light-emitting device 100.

Furthermore, the nanorod light-emitting device 100 may further include a contact layer 108 arranged on the second semiconductor layer 107 to provide an ohmic contact. The contact layer 108 may be doped as the same conductive type as that of the second semiconductor layer 107. For example, when the second semiconductor layer 107 is doped as a p type, the contact layer 108 may be doped as a p type. The contact layer 108 may include, for example, gallium indium phosphide (GaInP) and GaAs.

The nanorod light-emitting device 100 according to the example embodiment may have a shape of a nanorod having a very small size in nanometers or micrometers. For example, the nanorod light-emitting device 100 may have the outer diameter D1 of from about 0.05 μm to about 2 μm. The nanorod light-emitting device 100 having a nanorod shape may have a substantially uniform outer diameter along a longitudinal direction. For example, the first semiconductor layer 103, the emission layer 105, the second semiconductor layer 107, and the contact layer 108 may have substantially the same outer diameter. Furthermore, when a length between a lower surface of the first semiconductor layer 103 and an upper surface of the second semiconductor layer 107 or a length between the lower surface of the first semiconductor layer 103 and an upper surface of the contact layer 108 is referred to as a height H of the nanorod light-emitting device 100, the height H of the nanorod light-emitting device 100 may range from about 1 μm to about 20 μm. Furthermore, the nanorod light-emitting device 100 may have, for example, an aspect ratio of at least 5. In general, the outer diameter D1 of the nanorod light-emitting device 100 may be selected to be about 600 nm, and the height H of the nanorod light-emitting device 100 may be selected to be about 5 μm. In this case, the aspect ratio of the nanorod light-emitting device 100 may be slightly greater than 8.

However, when the nanorod light-emitting device 100 having a relatively large aspect ratio is manufactured in a small size, a surface to volume ratio increases, thus a surface defect of the emission layer 105 may increase. For example, a surface defect may occur in an outer surface of the emission layer 105 due to a dangling bond, wherein the dangling bond increases as the surface to volume ratio increases, thus increasing the surface defect. Such a surface defect interrupts a flow of current, causing deterioration of the luminous efficiency of the emission layer 105.

The first current passage layer 104 and the second current passage layer 106 respectively arranged on a lower surface and an upper surface of the emission layer 105 concentrate a current to a center portion of the emission layer 105, in which almost no surface defect occurs, so as to improve the luminous efficiency of the emission layer 105. To this end, the first current passage layer 104 may include a first current blocking layer 104a arranged between an edge of the lower surface of the emission layer 105 and an edge of an upper surface of the first semiconductor layer 103 and a first conductive layer 104b arranged between a center portion of the lower surface of the emission layer 105 and a center portion of the upper surface of the first semiconductor layer 103. Therefore, the first current blocking layer 104a may have a ring shape surrounding a sidewall of the first conductive layer 104b in the same layer as the first conductive layer 104b. Furthermore, the second current passage layer 106 may include a second current blocking layer 106a arranged between an edge of the upper surface of the emission layer 105 and an edge of a lower surface of the second semiconductor layer 107 and a second conductive layer 106b arranged between a center portion of the upper surface of the emission layer 105 and a center portion of the lower surface of the second semiconductor layer 107. The second current blocking layer 106b may have a ring shape surrounding a sidewall of the second conductive layer 106b in the same layer as the second conductive layer 106b. Furthermore, a thickness t of the first current blocking layer 104a may be the same as a thickness of the first conductive layer 104b, and a thickness of the second current blocking layer 106a may be the same as a thickness of the second conductive layer 106b. For example, the thicknesses t of the first current blocking layer 104a and the second current blocking layer 106a may range from about 5 nm to about 200 nm.

Outer diameters of the first current blocking layer 104a and the second current blocking layer 106a may have the same range as the outer diameter D1 of the nanorod light-emitting device 100, for example, from about 0.05 μm to about 2 μm. Therefore, the first semiconductor layer 103, the first current blocking layer 104a, the emission layer 105, the second current blocking layer 106a, and the second semiconductor layer 107 may have the same diameter. Diameters D2 of the first conductive layer 104b and the second conductive layer 106b may be at least about 0.01 μm, and may be less than the outer diameters of the first current blocking layer 104a and the second current blocking layer 106a.

In this structure, the first current blocking layer 104a and the second current blocking layer 106a may prevent or reduce a current from flowing to a vicinity of a surface of the emission layer 105, in which a surface defect is present, and a current is supplied only to the center portion of the emission layer 105, in which almost no surface defect occurs, through the first conductive layer 104b and the second conductive layer 106b. Therefore, the nanorod light-emitting device 100 may have high luminous efficiency while having a small size and a large aspect ratio.

In FIG. 1, the first current passage layer 104 and the second current passage layer 106 are illustrated as being arranged on both of the lower surface and the upper surface of the emission layer 105, but embodiments are not limited thereto. For example, the nanorod light-emitting device 100 may include only one of the first current passage layer 104 arranged on the lower surface of the emission layer 105 and the second current passage layer 106 arranged on the upper surface of the emission layer 105.

FIGS. 2A to 2E are cross-sectional views schematically illustrating a method of manufacturing the nanorod light-emitting device 100 according to an example embodiment.

Figure 2A:
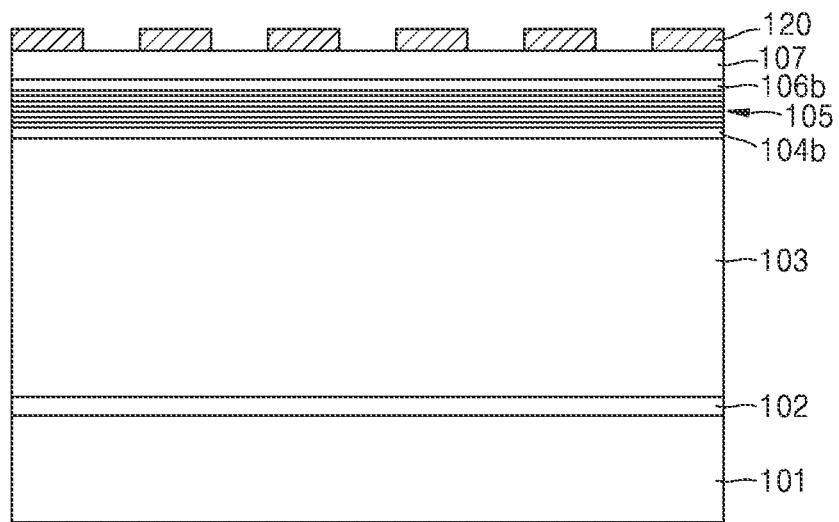
FIGS. 2A to 2E are cross-sectional views schematically illustrating a method of manufacturing a nanorod light-emitting device according to an example embodiment.

Referring to FIG. 2A, the sacrificial layer 102, the first semiconductor layer 103, the first conductive layer 104b, the emission layer 105, the second conductive layer 106b, and the second semiconductor layer 107 are sequentially grown on the substrate 101. The sacrificial layer 102 is arranged over a wide area of an upper surface of the substrate 101, the first semiconductor layer 103 is grown on an entire upper surface of the sacrificial layer 102, and the first conductive layer 104b is grown on an entire upper surface of the first semiconductor layer 103. Furthermore, each of the emission layer 105, the second conductive layer 106b, and the second semiconductor layer 107 may be grown so as to be arranged over an entire upper surface of a layer thereunder. The contact layer 108 may be further formed on the upper surface of the second semiconductor layer 107.

The substrate 101 and the sacrificial layer 102 may include, for example, n-GaAs. When the nanorod light-emitting device 100 is a light-emitting device for generating red light, the first semiconductor layer 103 may include, for example, n-aluminum gallium indium phosphide (AlGaInP), and the second semiconductor layer 107 may include p-AlGaInP. Therefore, the first semiconductor layer 103 may be a single layer including a semiconductor material of a single composition, the second semiconductor layer 107 may also be a single layer including the same semiconductor material as that of the first semiconductor layer 103, and the first semiconductor layer 103 and the second semiconductor layer 107 are doped as types that are opposite to each other. For example, the first semiconductor layer 103 may be doped as n-type with Si, and the second semiconductor layer 107 may be doped as p-type with Zn. Furthermore, when the contact layer 108 is further formed, the contact layer 108 may include, for example, p-GaInP or p-GaAs, or both of p-GaInP and p-GaAs.

In the case where the emission layer 105 is configured to generate red light, the emission layer 105 may include, for example, AlGaInP. AlGaInP of the emission layer 105 may not be doped. The emission layer 105 includes a wall and a quantum well, and, to this end, aluminum (Al) content in AlGaInP may vary. For example, the wall may have higher Al content in AlGaInP than the quantum well. Furthermore, when compared with the first and second semiconductor layers 103 and 107, the Al content is highest in the first semiconductor layer 103 and the second semiconductor layer 107, the Al content is next highest in the wall of the emission layer 105, and the Al content is lowest in the quantum well of the emission layer 105. Therefore, in a conduction band, an energy level of the first semiconductor layer 103 and second semiconductor layer 107 is highest, an energy level of the wall of the emission layer 105 is next highest, and an energy level of the quantum well of the emission layer 105 is lowest.

After the second semiconductor layer 107 is formed, a hard mask 120 is formed on the second semiconductor layer 107 at regular intervals. When the contact layer 108 is formed on the second semiconductor layer 107, the hard mask 120 having a plurality of openings arranged at regular intervals may be formed on the contact layer 108. For example, the hard mask 120 may be formed by patterning a material of the hard mask 120 such that the hard mask 120 has a plurality of openings arranged at regular intervals using a lithography method after arranging the material of the hard mask 120 on an overall upper surface of the second semiconductor layer 107 or the contact layer 108. The hard mask 120 may be formed as, for example, a silicon oxide ($SiO_2$) single layer or $SiO_2$/Al double layer. The hard mask 120 may have a plurality of two-dimensionally arranged openings when viewed from above the hard mask 120.

Figure 2B:
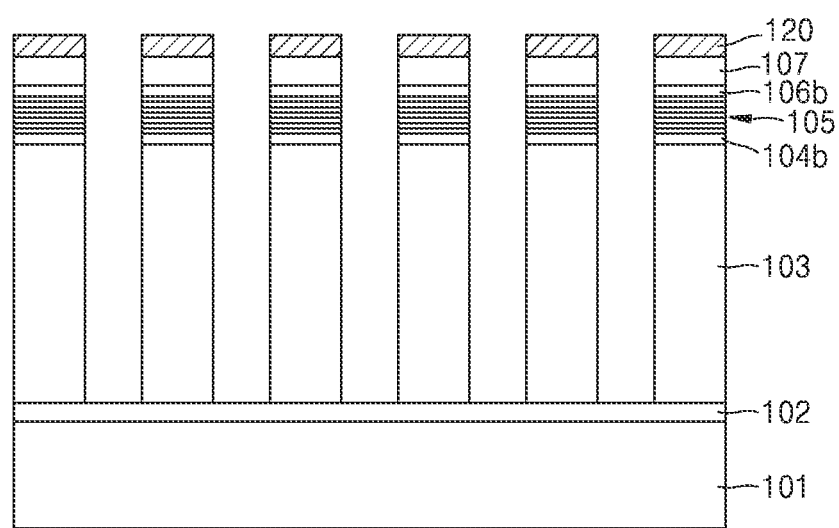

Referring to FIG. 2B, regions not covered with the hard mask 120 may be etched and removed using a dry etching method. For example, the second semiconductor layer 107, the second conductive layer 106b, the emission layer 105, the first conductive layer 104b, and the first semiconductor layer 103 under the openings of the hard mask 120 may be removed by being sequentially etched until the sacrificial layer 102 is exposed. Therefore, as illustrated in FIG. 2B, a plurality of nanorods including the first semiconductor layer 103, the first conductive layer 104b, the emission layer 105, the second conductive layer 106b, and the second semiconductor layer 107 may be formed on the sacrificial layer 102.

Figure 2C:
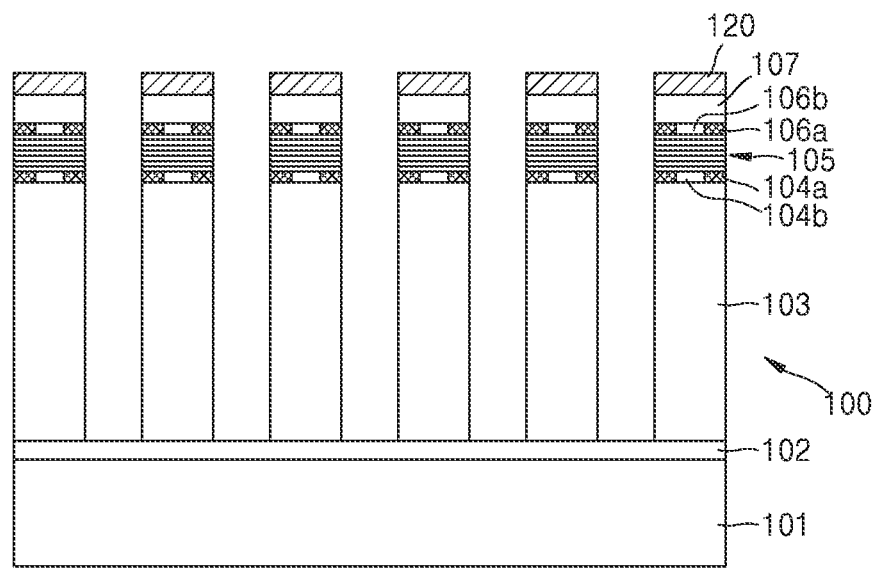

Next, referring to FIG. 2C, sidewalls of the first conductive layer 104b and the second conductive layer 106b may be oxidized to form the first current blocking layer 104a surrounding the sidewall of the first conductive layer 104b and the second current blocking layer 106a surrounding the sidewall of the second conductive layer 106b. To this end, the first conductive layer 104b and the second conductive layer 106b may include semiconductor materials that are easily oxidizable and have crystal structures similar to those of the first and second semiconductor layers 103 and 107 and the emission layer 105. For example, the first conductive layer 104b and the second conductive layer 106b may include a material including $Al_xGa_{1-x}As$ and is not doped. When $Al_xGa_{1-x}As$ is used as a material of the first conductive layer 104b and the second conductive layer 106b, an optical output of the nanorod light-emitting device 100 increases and $Al_xGa_{1-x}As$ is more easily oxidized as Al content increases. Furthermore, an oxidization rate decreases as the thicknesses of the first conductive layer 104b and the second conductive layer 106b decrease. Therefore, the thicknesses of the first conductive layer 104b and the second conductive layer 106b and an x value of $Al_xGa_{1-x}As$ may be appropriately adjusted. For example, the thicknesses of the first conductive layer 104b and the second conductive layer 106b may range from about 5 nm to about 200 nm, and the x value may be selected such that x≥0.85.

An oxidization process of the first conductive layer 104b and the second conductive layer 106b may be performed by increasing temperature to at least about 400° C. while flowing deionized water in an atmosphere of oxygen ($O_2$). As a result, Al in $Al_xGa_{1-x}As$ is oxidized from outermost sidewalls of the first conductive layer 104b and the second conductive layer 106b, thereby forming the first current blocking layer 104a and the second current blocking layer 106a. Therefore, the first current blocking layer 104a and the second current blocking layer 106a may include an oxide material formed by oxidizing the sidewalls of the first conductive layer 104b and the second conductive layer 106b. For example, the first current blocking layer 104a and the second current blocking layer 106a may include aluminum oxide (AlOx) that is an oxide of Al. Furthermore, the first current blocking layer 104a and the second current blocking layer 106a may partially include components such as Al, gallium (Ga), arsenide (As), and the like which remain without being oxidized. Since AlOx has an electrically high resistance, the first current blocking layer 104a and the second current blocking layer 106a may prevent or reduce a current from flowing to an outer sidewall of the emission layer 105.

In the process illustrated in FIG. 2C, the nanorod light-emitting device 100 illustrated in FIG. 1 may be completed when the hard mask 120 remaining on the second semiconductor layer 107 or the contact layer 108 is removed.

Through the processes illustrated in FIGS. 2A to 2C, a plurality of nanorod light-emitting devices 100 may be formed simultaneously.

Figure 2D:
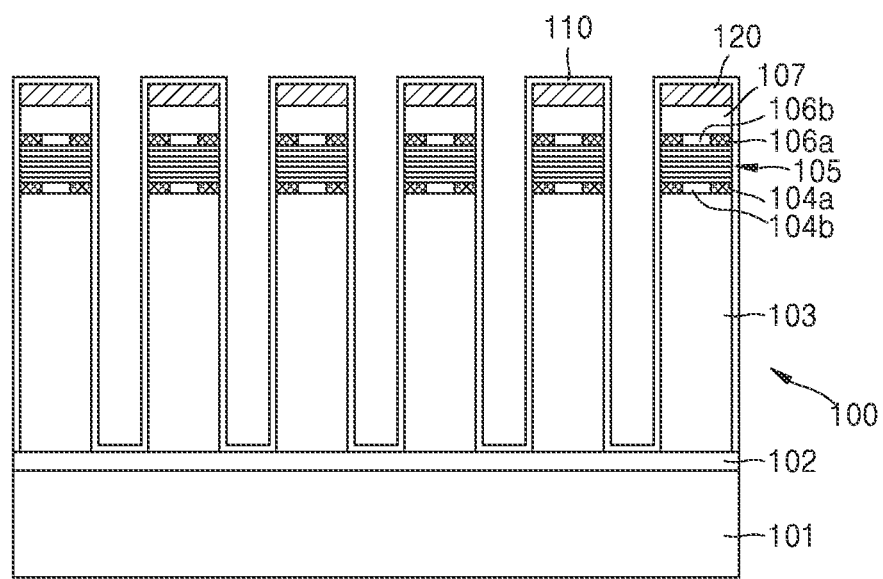

The passivation process illustrated in FIG. 2D may be further performed in order to further improve performance of the nanorod light-emitting device 100. Referring to FIG. 2D, a passivation film 110 may be formed to a regular thickness along surfaces of the plurality of nanorod light-emitting devices 100 and the sacrificial layer 102. As a result, sidewalls of the first semiconductor layer 103, the first current blocking layer 104a, the emission layer 105, the second current blocking layer 106a, and the second semiconductor layer 107 of each nanorod light-emitting device 100 are surrounded by the passivation film 110. The passivation film 110 may be formed using, for example, metal-organic chemical vapor deposition (MOCVD), atomic layer deposition (ALD), or the like.

This passivation film 110 may include, for example, a material which has an electrically high resistance and a large bandgap, such as AlOx, hafnium oxide (HfOx), titanium oxide (TiOx), silicon nitride (SiNx), silicon oxide (SiOx), or the like. Furthermore, the passivation layer 110 may also include an auto-oxidizable material. For example, the passivation film 110 may include $Al_xGa_{1-x}As$ (x≥0.9). As x content in $Al_xGa_{1-x}As$ increases, $Al_xGa_{1-x}As$ may be more easily oxidizable. Therefore, the passivation film 110 may be formed by auto-oxidizing $Al_xGa_{1-x}As$ without a particular process by selecting a large value of at least 0.9 as a value of x. In this case, the passivation film 110 mainly includes an AlOx component after oxidization of $Al_xGa_{1-x}As$.

In particular, when forming the passivation film 110 by growing a crystal of a material having a crystal structure similar to that of the emission layer 105, the passivation film 110 may have an epitaxial relationship with the emission layer 105. For example, a hetero junction is formed in an interface between the passivation film 110 and the emission layer 105. As a result, since a dangling bond is removed from an outer surface of the emission layer 105, a surface defect which occurs in the outer surface of the emission layer 105 may be reduced or prevented. Therefore, the emission layer 105 may recover from the surface defect so that the luminous efficiency of the nanorod light-emitting device 100 may be further improved. For example, the passivation film 110 formed by growing AlOx, HfOx, TiOx, $Al_xGa_{1-x}As$ (x≥0.9), or the like through MOCVD or ALD may have an epitaxial relationship with the emission layer 105.

Figure 2E:
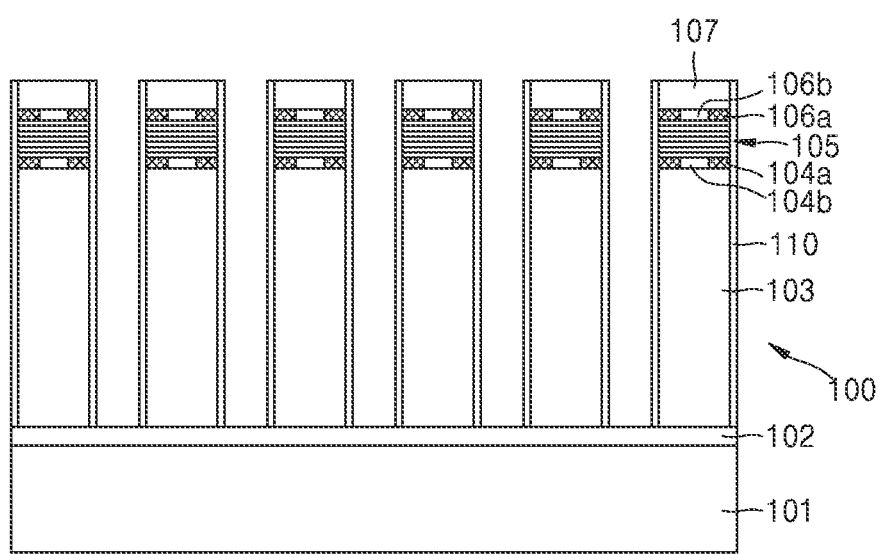

Referring to FIG. 2E, the material of the passivation film 110 remaining on the sacrificial layer 102 and the hard mask 120 remaining on the second semiconductor layer 107 or the contact layer 108 may be removed. As a result, the plurality of nanorod light-emitting devices 100 may be formed simultaneously on the substrate 101 and the sacrificial layer 102. Thereafter, the plurality of nanorod light-emitting devices 100 may be individually separated by removing the sacrificial layer 102. The substrate 101 and the sacrificial layer 102 may be cut in a vertical direction such that each nanorod light-emitting device 100 may be used in a state in which the substrate 101 and the sacrificial layer 102 are attached to each nanorod light-emitting device 100. At least two nanorod light-emitting devices 100 may be used together by cutting the substrate 101 and the sacrificial layer 102 in a vertical direction so that at least two nanorod light-emitting devices 100 remain.

Figure 3:
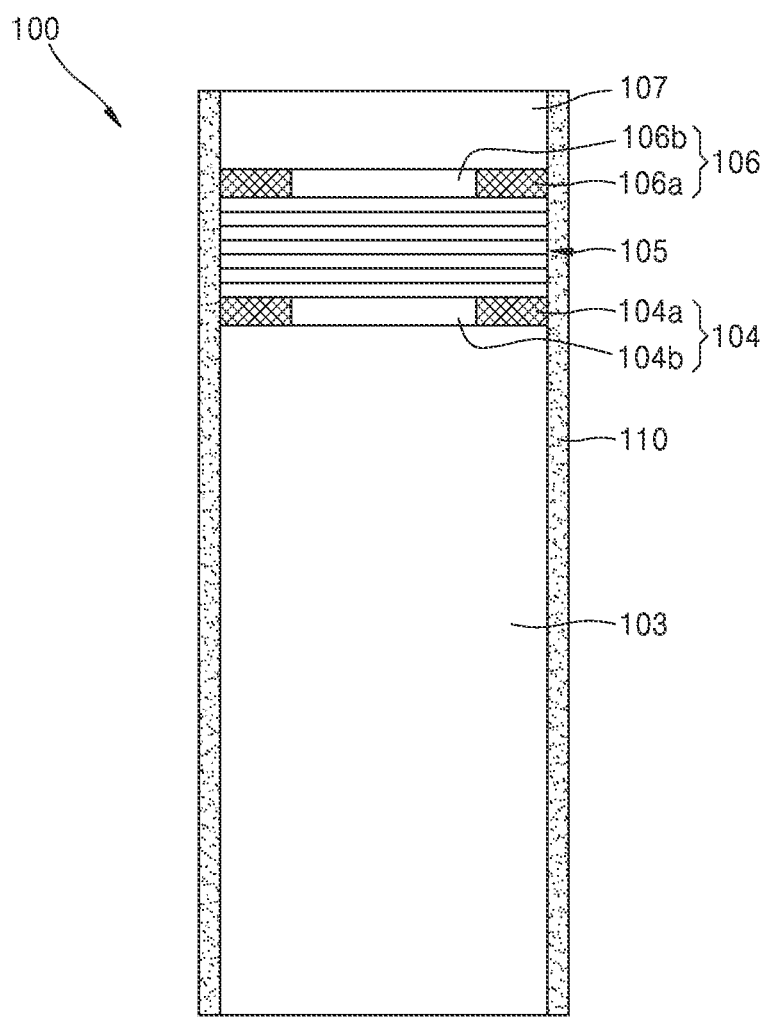
FIG. 3 is a cross-sectional view illustrating a schematic configuration of a nanorod light-emitting device manufactured using the method illustrated in FIGS. 2A to 2E.

FIG. 3 is a cross-sectional view illustrating a schematic configuration of one nanorod light-emitting device 100 manufactured using the method illustrated in FIGS. 2A to 2E. Referring to FIG. 3, the nanorod light-emitting device 100 may include the first semiconductor layer 103, the first current passage layer 104 arranged on the first semiconductor layer 103, the emission layer 105 arranged on the first current passage layer 104, the second current passage layer 106 arranged on the emission layer 105, the second semiconductor layer 107 arranged on the second current passage layer 106, and the passivation film 110 surrounding side surfaces of the foregoing layers. Furthermore, the first current passage layer 104 may include the first current blocking layer 104a and the first conductive layer 104b, and the second current passage layer 106 may include the second current blocking layer 106a and the second conductive layer 106b. Furthermore, contact layers for an ohmic contact may be further arranged, as necessary, on the lower surface of the first semiconductor layer 103 and the upper surface of the second semiconductor layer 107. As described above, the first semiconductor layer 103, the first current passage layer 104, the emission layer 105, the second current passage layer 106, and the second semiconductor layer 107 may have the same diameter and form a nanorod shape together.

Figure 4:
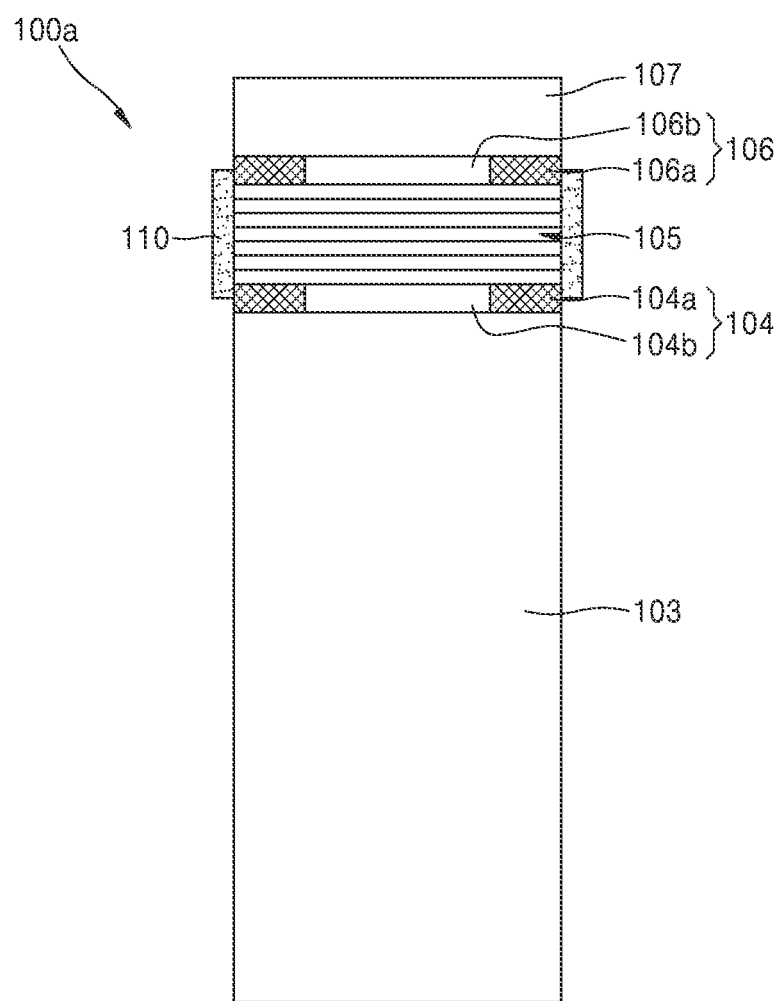
FIG. 4 is a cross-sectional view illustrating a schematic configuration of a nanorod light-emitting device according another example embodiment.

Although FIG. 3 illustrates that the passivation film 110 surrounds all of the sidewalls of the first semiconductor layer 103, the first current passage layer 104, the emission layer 105, the second current passage layer 106, and the second semiconductor layer 107, embodiments are not limited thereto. For example, FIG. 4 is a cross-sectional view illustrating a schematic configuration of a nanorod light-emitting device 100a according to another example embodiment. Referring to FIG. 4, the passivation film 110 may be formed to surround only the emission layer 105 or surround only a partial sidewall of the nanorod light-emitting device 100a including at least the emission layer 105.

Furthermore, although it has been described that the nanorod light-emitting devices 100 and 100a include the first current passage layer 104 and the second current passage layer 106 arranged respectively on the lower surface and the upper surface of the emission layer 105, the number and position of the current passage layers are not limited thereto. For example, FIGS. 5 and 6 are cross-sectional views illustrating schematic configurations of nanorod light-emitting devices according to other example embodiments.

Figure 5:
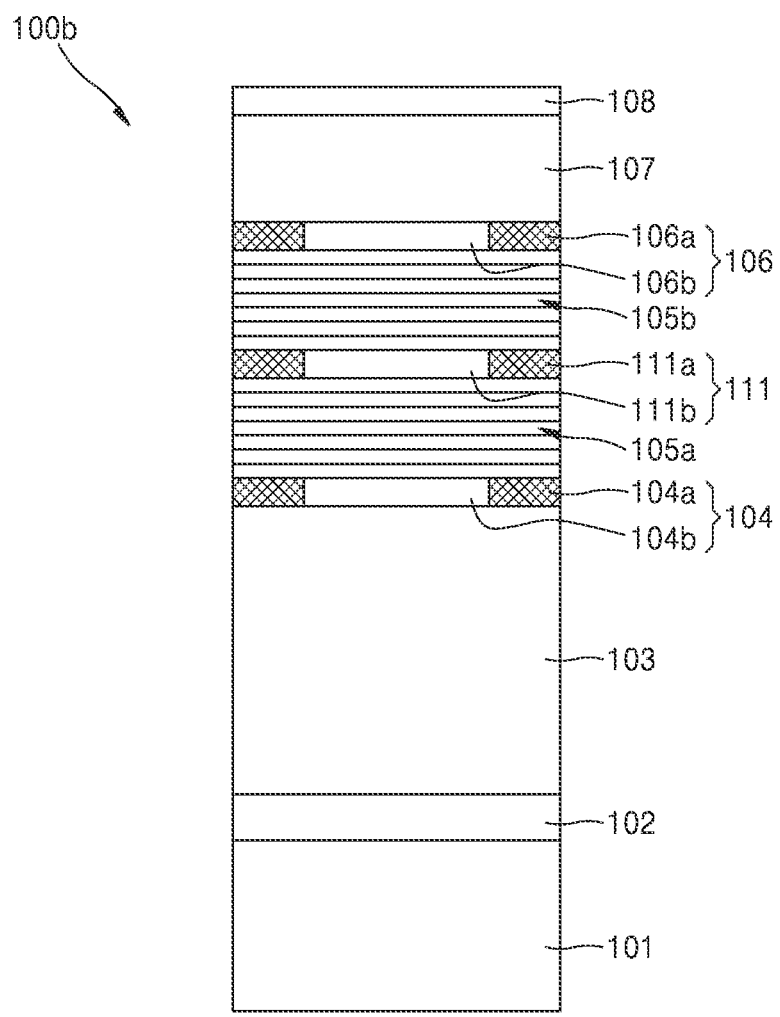
FIG. 5 is a cross-sectional view illustrating a schematic configuration of a nanorod light-emitting device according to another example embodiment.

Referring to FIG. 5, a nanorod light-emitting device 100b may further include a third current passage layer 111 in the emission layer 105. The emission layer 105 may include a first quantum well structure 105a between the first current passage layer 104 and the third current passage layer 111 and a second quantum well structure 105b between the third current passage layer 111 and the second current passage layer 106. The second quantum well structure 105b is arranged above the first quantum well structure 105a along a thickness direction of the nanorod light-emitting device 100b.

The third current passage layer 111 may include a third current blocking layer 111a arranged on an edge between the first quantum well structure 105a and the second quantum well structure 105b and a third conductive layer 111b arranged in a center portion between the first quantum well structure 105a and the second quantum well structure 105b. The third current blocking layer 111a may have a ring shape and be arranged to surround a sidewall of the third conductive layer 111b in the emission layer 105. The first conductive layer 104b, the second conductive layer 106b, and the third conductive layer 111b may have the same diameter. As a result, a current may be uniformly concentrated to the center portion of the emission layer 105 in an entire region of the emission layer 105.

Figure 6:
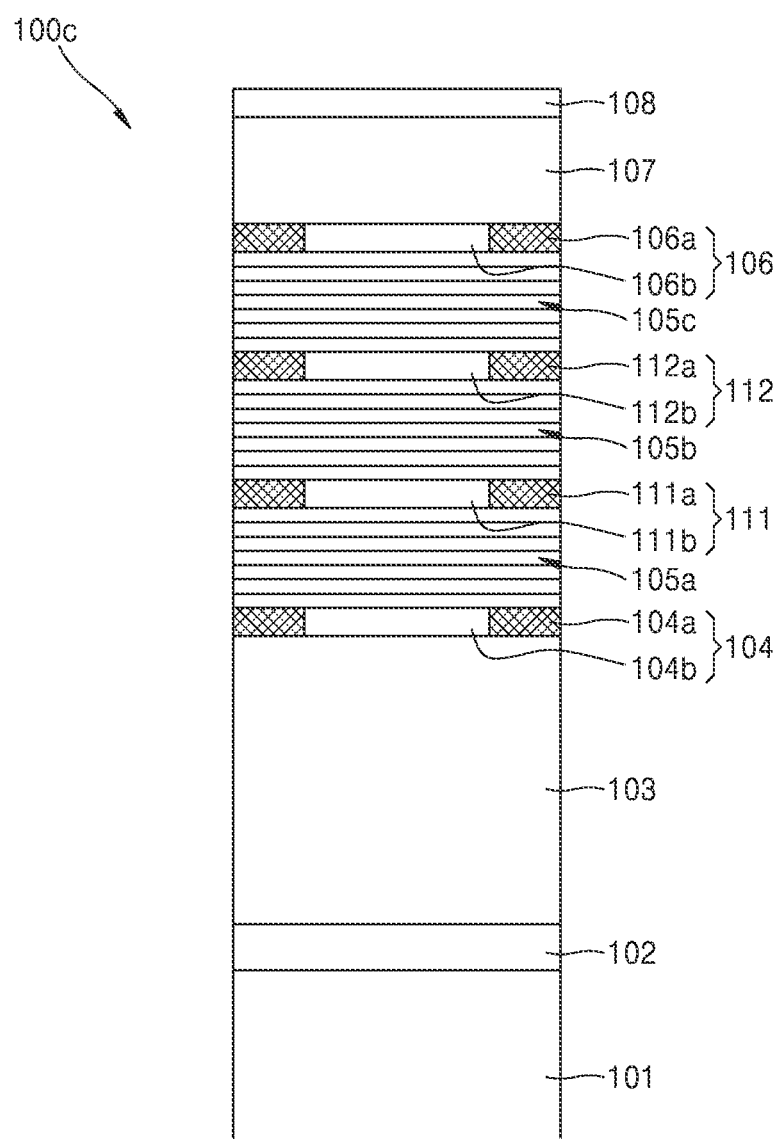
FIG. 6 is a cross-sectional view illustrating a schematic configuration of a nanorod light-emitting device according to another example embodiment.

Furthermore, referring to FIG. 6, a nanorod light-emitting device 100c may further include the third current passage layer 111 and a fourth current passage layer 112 in the emission layer 105. The emission layer 105 may include the first quantum well structure 105a between the first current passage layer 104 and the third current passage layer 111, the second quantum well structure 105b between the third current passage layer 111 and the fourth current passage layer 112, and a third quantum well structure 105c between the fourth current passage layer 112 and the second current passage layer 106. The first quantum well structure 105a, the second quantum well structure 105b, and the third quantum well structure 105c may be sequentially arranged along a thickness direction of the nanorod light-emitting device 100c.

The third current passage layer 111 may include the third current blocking layer 111a arranged on an edge between the first quantum well structure 105a and the second quantum well structure 105b and the third conductive layer 111b arranged in a center portion between the first quantum well structure 105a and the second quantum well structure 105b. The fourth current passage layer 112 may include a fourth current blocking layer 112a arranged on an edge between the second quantum well structure 105b and the third quantum well structure 105c and a fourth conductive layer 112b arranged in a center portion between the second quantum well structure 105b and the third quantum well structure 105c. The third current blocking layer 111a may be arranged to surround a sidewall of the third conductive layer 111b, and the fourth current blocking layer 112a may have a ring shape and be arranged to surround a sidewall of the fourth conductive layer 112b. The first conductive layer 104b, the second conductive layer 106b, the third conductive layer 111b, and the fourth conductive layer 112b may have the same diameter.

Current passage layers may be further added in this manner as the number of quantum wells in the emission layer 105 increases. For example, a plurality of MQW structures and a plurality of current passage layers may be alternately arranged in the emission layer 105 as the number of quantum wells in the emission layer 105 increases. In this case, a single MQW structure between two current passage layers may include, for example, one to about 10 quantum wells.

Figure 7:
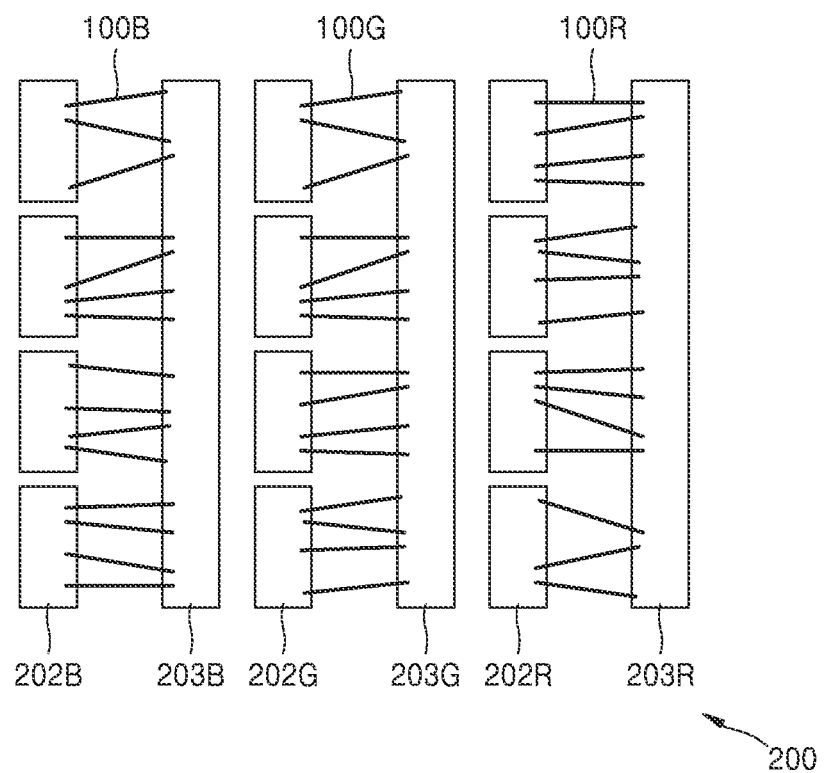
FIG. 7 is a conceptual diagram illustrating a schematic configuration of a display apparatus including a nanorod light-emitting device according to an example embodiment.

This nanorod light-emitting device 100 may be variously applied. In particular, the nanorod light-emitting device 100 may be used as a light-emitting element of pixels of a next-generation display apparatus. For example, FIG. 7 is a conceptual diagram illustrating a schematic configuration of a display apparatus using the nanorod light-emitting device 100 according to an example embodiment. Referring to FIG. 7, a display apparatus 200 may include a plurality of first pixel electrodes 202B, a first common electrode 203B corresponding to the plurality of first pixel electrodes 202B, a plurality of second pixel electrodes 202G, a second common electrode 203G corresponding to the plurality of second pixel electrodes 202G, a plurality of third pixel electrodes 202R, a third common electrode 203R corresponding to the plurality of third pixel electrodes 202R. The display apparatus 200 may also include a plurality of nanorod light-emitting devices 100B connected between each first pixel electrode 202B and the first common electrode 203B, a plurality of second nanorod light-emitting devices 100G connected between each second pixel electrode 202G and the second common electrode 203G, and a plurality of third nanorod light-emitting devices 100R connected between each third pixel electrode 202R and the third common electrode 203R.

For example, the first nanorod light-emitting device 100B may be configured to emit blue light, the second nanorod light-emitting device 100G may be configured to emit green light, and the third nanorod light-emitting device 100R may be configured to emit red light. Furthermore, the single first pixel electrode 202B may form a single blue subpixel with the first common electrode 203B, the single second pixel electrode 202G may form a single green subpixel with the second common electrode 203G, and the single third pixel electrode 202R may form a single red subpixel with the third common electrode 203R.

Figure 8A:
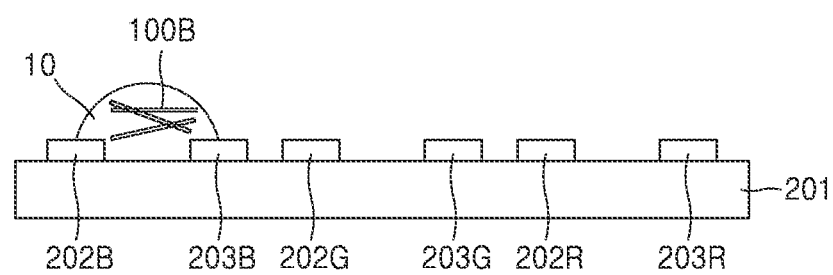
FIGS. 8A, 8B, and 8C exemplarily illustrate a process of arranging a plurality of nanorod light-emitting devices between a pixel electrode and a common electrode to manufacture the display apparatus illustrated in FIG. 7.
Figure 8B:
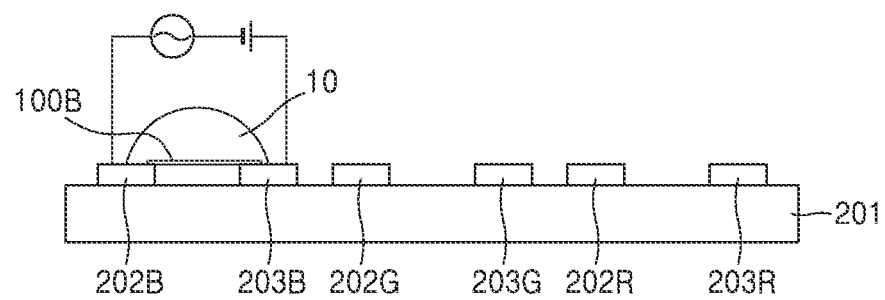
Figure 8C:
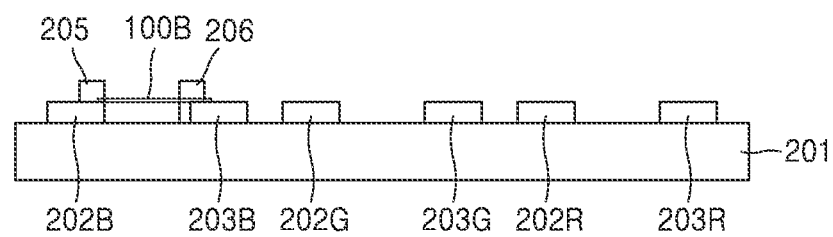

FIGS. 8A to 8C exemplarily illustrate a process of arranging the plurality of first nanorod light-emitting devices 100b between the first pixel electrode 202B and the first common electrode 203B to manufacture the display apparatus 200 illustrated in FIG. 7 according to an example embodiment.

Referring to FIG. 8A, the first pixel electrode 202B, the first common electrode 203B, the second pixel electrode 202G, the second common electrode 203G, the third pixel electrode 202R, and the third common electrode 203R are formed on a substrate 201. A driving circuit may be further arranged on the substrate 201 or in the substrate 201, the driving circuit being connected to the first pixel electrode 202B, the first common electrode 203B, the second pixel electrode 202G, the second common electrode 203G, the third pixel electrode 202R, and the third common electrode 203R to control lighting operation of the first nanorod light-emitting device 100B, the second nanorod light-emitting device 1000, and the third nanorod light-emitting device 100R. Thereafter, a solution 10 containing the plurality of first nanorod light-emitting devices 100B may be dispersed in a region between the first pixel electrode 202B and the first common electrode 203B. An inkjet print method may be used to disperse the solution but embodiments are not limited thereto.

Referring to FIG. 8B, an electric field is applied between the first pixel electrode 202B and the first common electrode 203b. As a result, due to the electric field, the plurality of first nanorod light-emitting devices 100B may be self-aligned between the first pixel electrode 202B and the first common electrode 203B. Here, the order in which dispersion of the solution 10 and application of an electric field are performed may be changed. For example, the solution 10 containing the plurality of first nanorod light-emitting devices 100B may be dispersed in the region between the first pixel electrode 202B and the first common electrode 203B in a state in which an electric field is applied between the first pixel electrode 202B and the first common electrode 203B.

When the plurality of first nanorod light-emitting devices 100B are self-aligned, a first contact electrode 205 may be formed on the first pixel electrode 202B to electrically and/or physically stably connect the first nanorod light-emitting device 100b, and a second contact electrode 206 may be formed on the first common electrode 203B to electrically and/or physically stably connect the first nanorod light-emitting device 100b, as illustrated in FIG. 8C.

The process illustrated in FIGS. 8A to 8C may also be applied to a process of arranging the second nanorod light-emitting device 100G between the second pixel electrode 202G and the second common electrode 203G and a process of arranging the third nanorod light-emitting device 100R between the third pixel electrode 202R and the third common electrode 203R.

Figure 9:
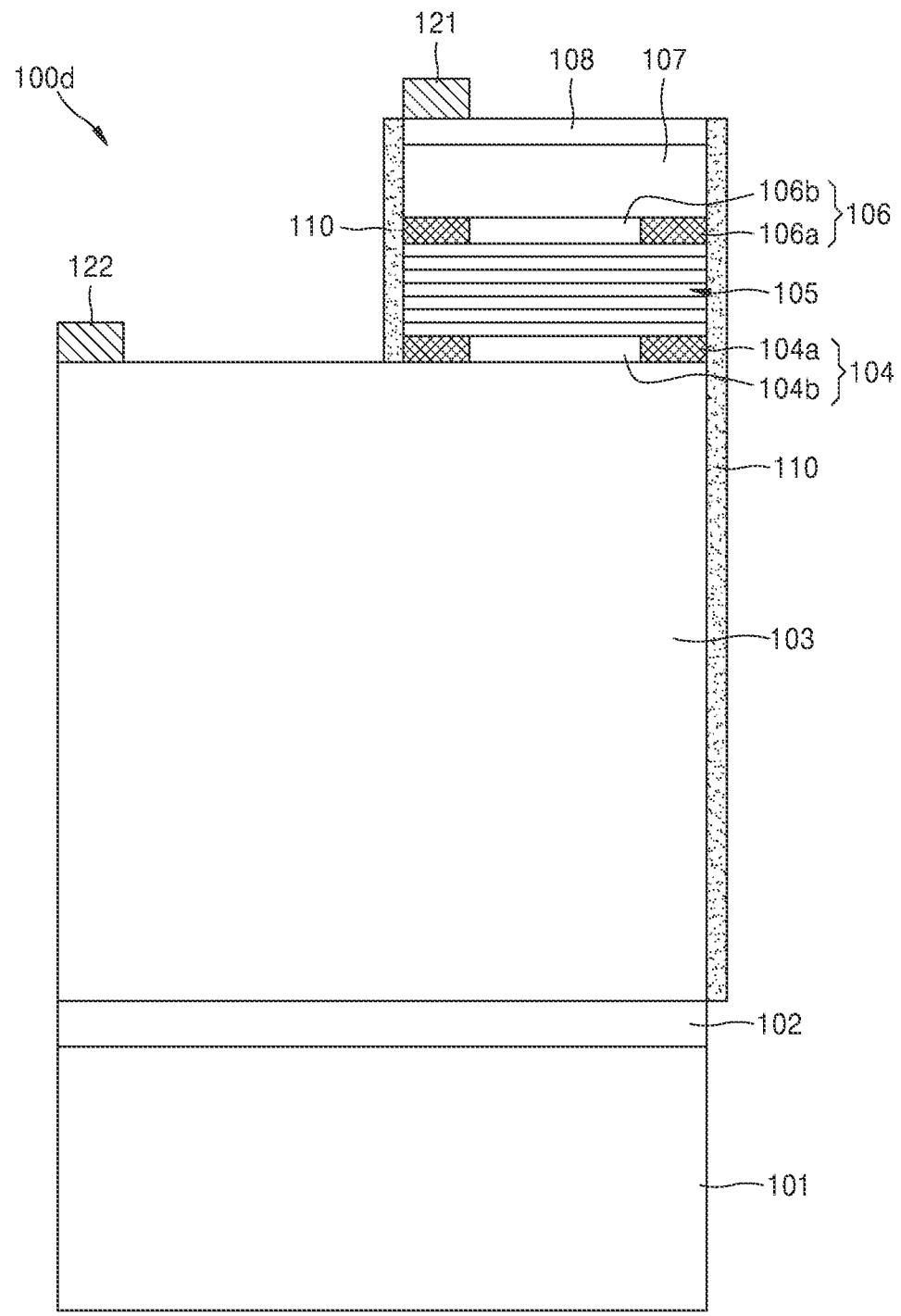
FIG. 9 is a cross-sectional view illustrating a schematic configuration of a nanorod light-emitting device according to another example embodiment.

FIG. 9 is a cross-sectional view illustrating a schematic configuration of a nanorod light-emitting device according to another example embodiment. Referring to FIG. 9, a nanorod light-emitting device 100d according to another example embodiment may include the substrate 101, the sacrificial layer 102, a first semiconductor layer 103', the first current passage layer 104, the emission layer 105, the second current passage layer 106, the second semiconductor layer 107, the contact layer 108, and the passivation film 110. The first current passage layer 104 may include the first current blocking layer 104a and the first conductive layer 104b, and the second current passage layer 106 may include the second current blocking layer 106a and the second conductive layer 106b.

In the nanorod light-emitting device 100d illustrated in FIG. 9, widths or diameters of the substrate 101, the sacrificial layer 102, and the first semiconductor layer 103' are larger than widths or diameters of the other layers. For example, the widths or diameters of the first current passage layer 104, the emission layer 105, the second current passage layer 106, the second semiconductor 107, and the contact layer 108 are less than the widths or diameters of the substrate 101, the sacrificial layer 102, and the first semiconductor layer 103'. For example, the contact layer 108, the second semiconductor layer 107, the second current passage layer 106, the emission layer 105, and the first current passage layer 104 may be partially etched and removed to expose a portion of an upper surface of the first semiconductor layer 103'. A first electrode 122 may be further arranged on an exposed upper surface of the first semiconductor layer 103', and a second electrode 121 may be further arranged on the upper surface of the contact layer 108.

As illustrated in FIG. 9, first sidewalls of the substrate 101, the sacrificial layer 102, the first semiconductor layer 103', the first current passage layer 104, the emission layer 105, the second current passage layer 106, the second semiconductor layer 107, and the contact layer 108 may be flush with each other in a vertical direction. Furthermore, second sidewalls of the substrate 101, the sacrificial layer 102, and the first semiconductor layer 103', which are opposite to the first sidewalls, may horizontally protrude over second sidewalls of the first current passage layer 104, the emission layer 105, the second current passage layer 106, the second semiconductor layer 107, and the contact layer 108.

In this case, the passivation film 110 may be arranged to surround the first sidewalls of the first semiconductor layer 103', the first current passage layer 104, the emission layer 105, the second current passage layer 106, the second semiconductor layer 107, and the contact layer 108 and surround the second sidewalls of the first current passage layer 104, the emission layer 105, the second current passage layer 106, the second semiconductor layer 107, and the contact layer 108. However, embodiments are not limited thereto. For example, the passivation film 110 may be arranged to surround only a partial region including at least the emission layer 105, as illustrated in FIG. 4.

The nanorod light-emitting devices 100, 100a, 100b, and 100c illustrated in FIGS. 1, 3, 4, 5, and 6 may be arranged to be provided on a substrate and may be connected to two electrodes that are flush with each other and arranged on the substrate, as illustrated in FIG. 7. On the contrary, the nanorod light-emitting device 100d illustrated in FIG. 9 may be arranged so as to stand upright on a substrate. To this end, the widths or diameters of the substrate 101, the sacrificial layer 102, and the first semiconductor layer 103' of the nanorod light-emitting device 100d illustrated in FIG. 9 may be, for example, about 30 μm or more.

Figure 10:
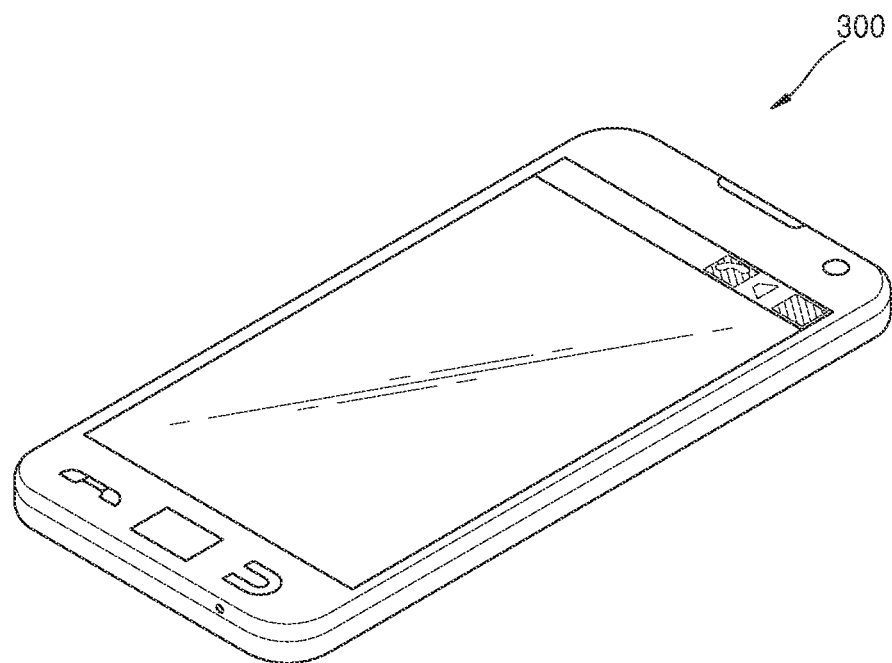
FIGS. 10, 11, 12, 13, 14, 15, and 16 illustrate examples of various display apparatuses including nanorod light-emitting devices according to example embodiments.
Figure 11:
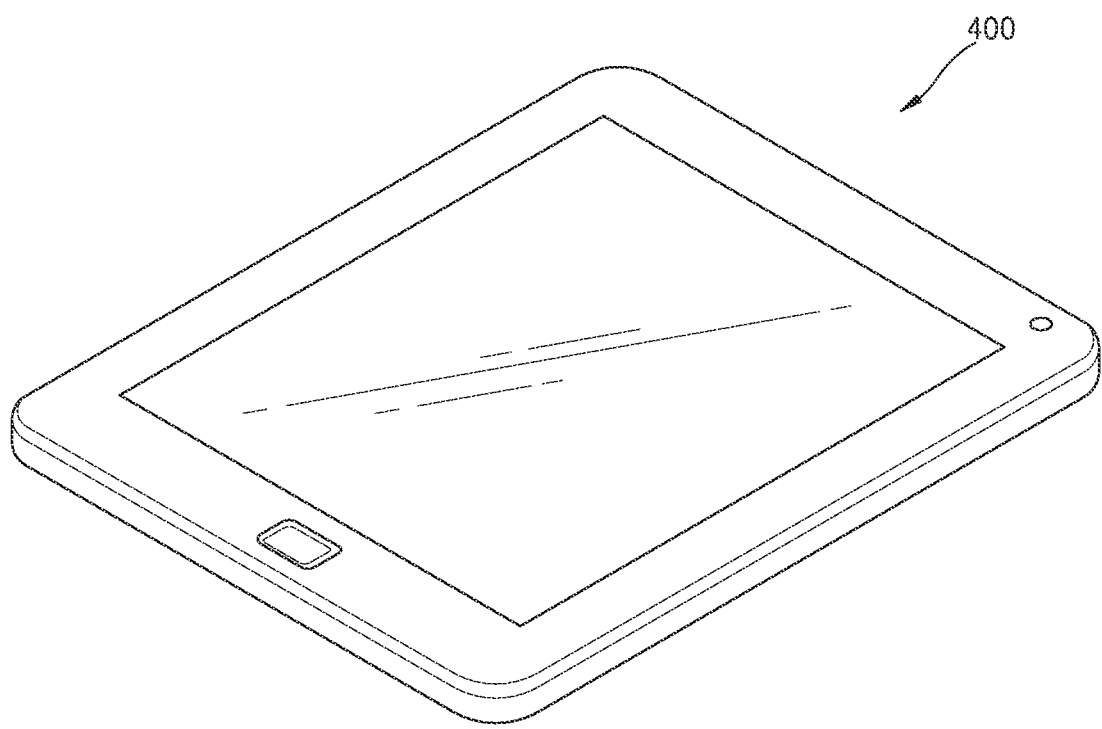
Figure 12:
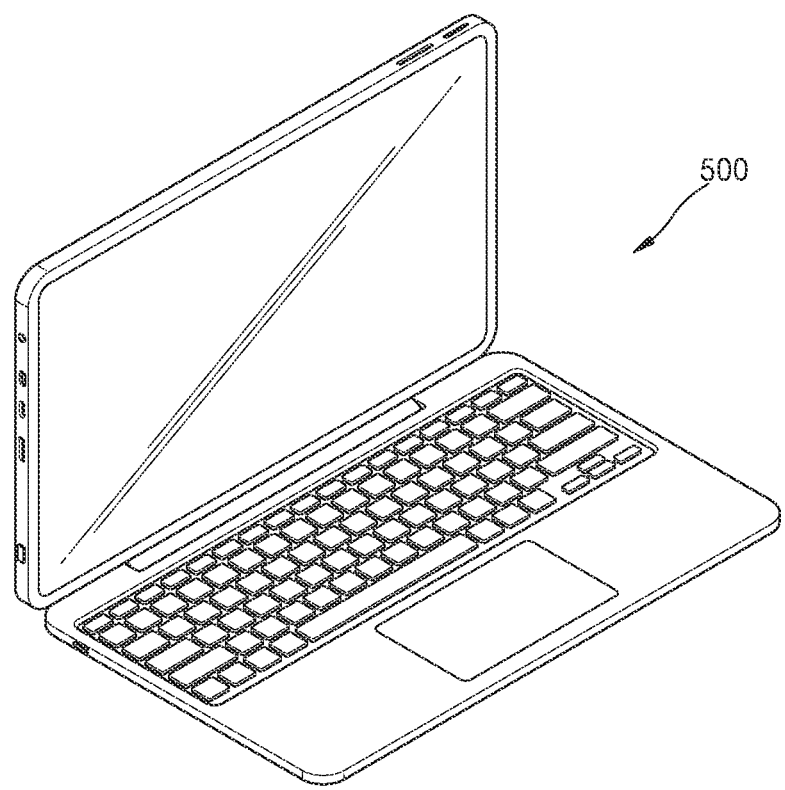
Figure 13:
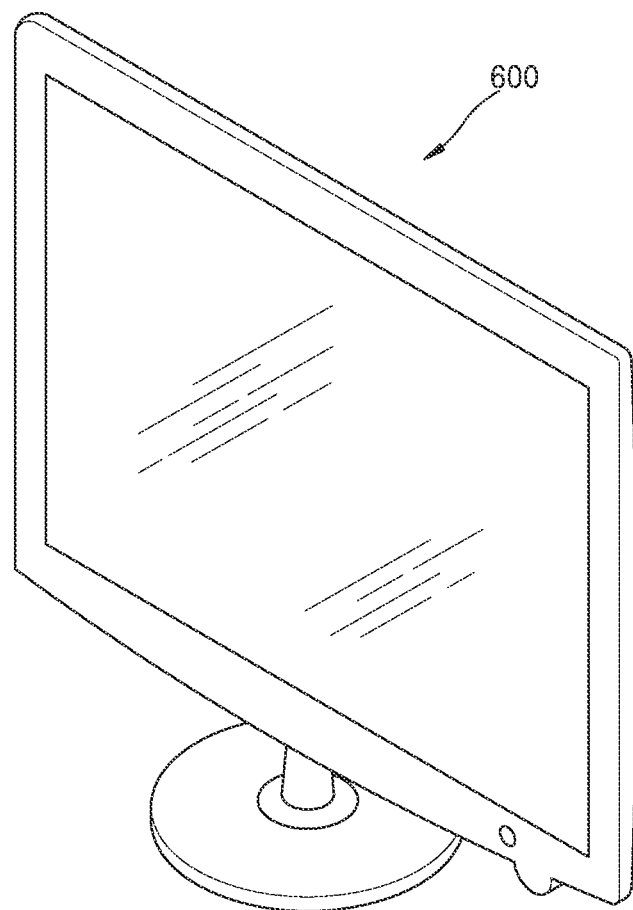
Figure 14:
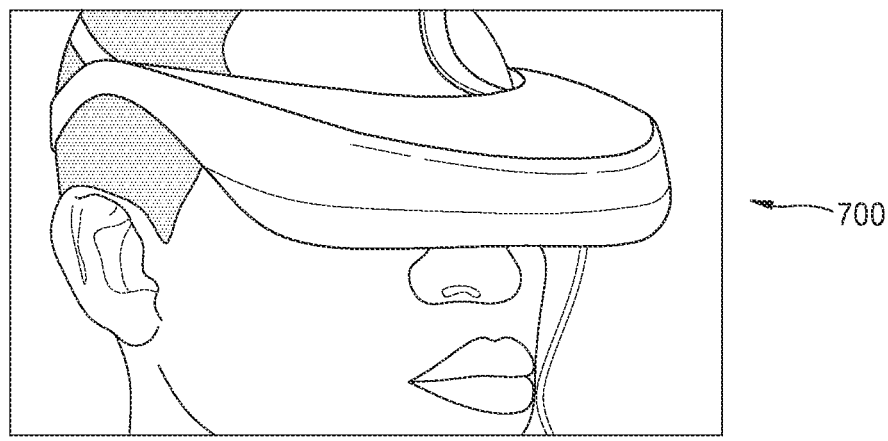
Figure 15:
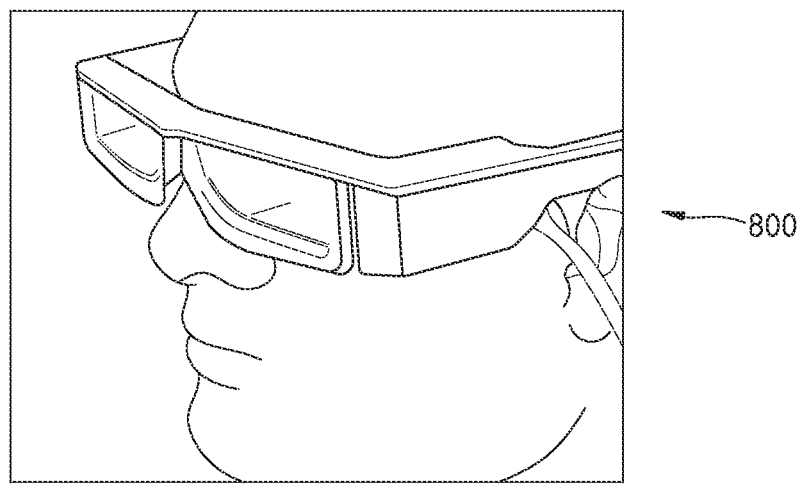
Figure 16:
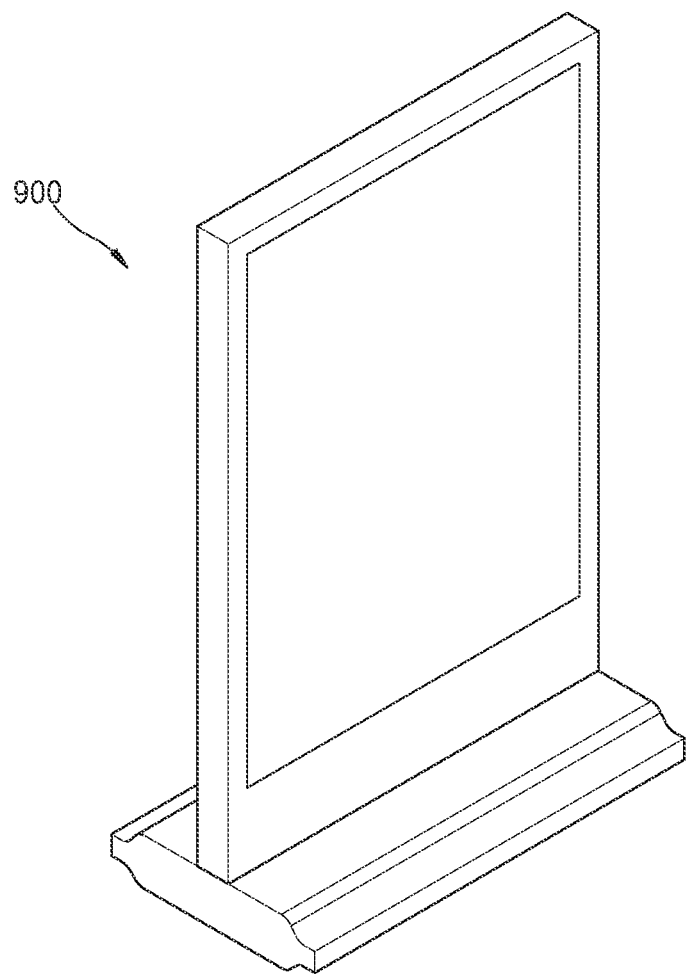

The nanorod light-emitting devices according to the above example embodiments may be limitlessly applied to display apparatuses having various sizes and used for various purposes. For example, FIGS. 10 to 16 illustrate examples of various display apparatuses in which nanorod light-emitting devices according to example embodiments may be applied. The nanorod light-emitting devices may be applied to a display panel of a mobile phone or smartphone 300 as illustrated in FIG. 10, and may be applied to a display panel of a tablet or smart tablet 400 as illustrated in FIG. 11. Furthermore, the nanorod light-emitting devices according to example embodiments may be applied to a display panel of a laptop computer 500 as illustrated in FIG. 12, and may be applied to a display panel of a television or smart television 600 as illustrated in FIG. 13. Furthermore, as illustrated in FIGS. 14 and 15, the nanorod light-emitting devices may be applied to small display panels used in a head-mounted display (HMD) 700, a glasses-type display, or a goggle-type display 800. Furthermore, the nanorod light-emitting devices may be applied to large display panels used in a signage 900 as illustrated in FIG. 16, a large electronic display board, a cinema screen, or the like.

Although the nanorod light-emitting devices having a centralized current passage structure and the method of manufacturing the same have been described with reference to the example embodiments illustrated in the drawings, it should be understood that other various modifications and equivalent embodiments could be made by those skilled in the art. Therefore, the example embodiments disclosed herein should be considered to be not limitative but illustrative. The scope of rights should be defined by the claims rather than the above description, and all differences that fall within the same scope as the claims should be construed as being included in the scope of rights.

It should be understood that example embodiments described herein should be considered in a descriptive sense only and not for purposes of limitation. Descriptions of features or aspects within each example embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims.

What is claimed is:

1. A nanorod light-emitting device comprising:
   a first semiconductor layer doped with a first conductive type impurity;
   an emission layer disposed above the first semiconductor layer, the emission layer comprising a first quantum well structure;
   a second semiconductor layer disposed above the emission layer and doped with a second conductive type impurity that is electrically opposite to the first conductive type impurity;
   a conductive layer disposed between at least one of:
      a center portion of a lower surface of the first quantum well structure and the first semiconductor layer; and
      a center portion of an upper surface of the first quantum well structure and the second semiconductor layer; and
   a current blocking layer surrounding a sidewall of the conductive layer, wherein the current blocking layer is interposed between
at least one of:
an edge of the lower surface of the first quantum well
structure and an edge of an upper surface of the first
semiconductor layer;
an edge of the upper surface of the first quantum well
structure and an edge of a lower surface of the
second semiconductor layer, and
wherein a diameter of the current blocking layer is equal
to a diameter of the emission layer and larger than a
diameter of the conductive layer.

2. The nanorod light-emitting device of claim 1, wherein the first semiconductor layer is a single layer including a semiconductor material with a single composition.

3. The nanorod light-emitting device of claim 2, wherein the second semiconductor layer is a single layer including a semiconductor material with a single composition which is same as the semiconductor material of the first semiconductor layer.

4. The nanorod light-emitting device of claim 1, wherein the current blocking layer includes an oxide material.

5. The nanorod light-emitting device of claim 1, wherein the conductive layer comprises:
a first conductive layer disposed between the center portion of the lower surface of the emission layer and the first semiconductor layer; and
a second conductive layer disposed between the center portion of the upper surface of the emission layer and the second semiconductor layer.

6. The nanorod light-emitting device of claim 5, wherein the current blocking layer comprises:
a first current blocking layer surrounding a sidewall of the first conductive layer between the lower surface of the first quantum well structure and the first semiconductor layer; and
a second current blocking layer surrounding a sidewall of the second conductive layer between the upper surface of the first quantum well structure and the second semiconductor layer.

7. The nanorod light-emitting device of claim 6, wherein the first current blocking layer has a ring shape in the same layer as the first conductive layer, and the second current blocking layer has a ring shape in the same layer as the second conductive layer.

8. The nanorod light-emitting device of claim 6, wherein a thickness of the first current blocking layer is equal to a thickness of the first conductive layer, and a thickness of the second current blocking layer is equal to a thickness of the second conductive layer.

9. The nanorod light-emitting device of claim 6, wherein the emission layer further comprises a second quantum well structure,
wherein the conductive layer further comprises a third conductive layer disposed in a center portion between the first quantum well structure and the second quantum well structure, and
wherein the current blocking layer further comprises a third current blocking layer surrounding a sidewall of the third conductive layer and provided between the first quantum well structure and the second quantum well structure.

10. The nanorod light-emitting device of claim 1, wherein a diameter of the first semiconductor layer, the diameter of the current blocking layer, the diameter of the emission layer, and a diameter of the second semiconductor layer are equal to one another.

11. The nanorod light-emitting device of claim 1, wherein the diameter of the current blocking layer ranges from 0.05 µm to 2 µm.

12. The nanorod light-emitting device of claim 11, wherein the diameter of the conductive layer is greater than or equal to 0.01 µm and is less than the outer diameter of the current blocking layer.

13. The nanorod light-emitting device of claim 1, wherein a height of the nanorod light-emitting device ranges from 1 µm to 20 µm.

14. The nanorod light-emitting device of claim 12, wherein the thickness of the current blocking layer ranges from 5 nm to 200 nm.

15. The nanorod light-emitting device of claim 1, wherein the conductive layer includes $Al_xGa_{1-x}As$, where x satisfies $x \geq 0.85$, the current blocking layer includes $AlO_x$, and the first semiconductor layer and the second semiconductor layer each include AlGaInP.

16. The nanorod light-emitting device of claim 1, further comprising a passivation film surrounding side surfaces of the current blocking layer and the emission layer.

17. The nanorod light-emitting device of claim 15, wherein the passivation film includes at least one material selected from among $AlO_x$, $HfO_x$, $TiO_x$, $SiN_x$, $SiO_x$, and $Al_xGa_{1-x}As$, where x satisfies $x \geq 0.9$.

18. The nanorod light-emitting device of claim 15, wherein the passivation film includes a material having an epitaxial relationship with the emission layer to form a hetero junction at an interface between the passivation film and the emission layer.

19. The nanorod light-emitting device of claim 1, wherein the current blocking layer, the emission layer, and the second semiconductor layer have a same first diameter, and the first semiconductor layer has a second diameter that is larger than the first diameter.

20. A display apparatus comprising:
a plurality of pixel electrodes;
a common electrode corresponding to the plurality of pixel electrodes; and
a plurality of nanorod light-emitting devices connected between each pixel electrode and the common electrode,
wherein each nanorod light-emitting device comprises:
a first semiconductor layer doped with a first conductive type impurity;
an emission layer disposed above the first semiconductor layer, the emission layer comprising a quantum well structure;
a second semiconductor layer disposed above the emission layer and doped with a second conductive type impurity that is electrically opposite to the first conductive type impurity;
a conductive layer disposed between at least one of:
a center portion of a lower surface of the emission layer and the first semiconductor layer; and
a center portion of an upper surface of the emission layer and the second semiconductor layer; and
a current blocking layer surrounding a sidewall of the conductive layer,
wherein the current blocking layer is interposed between at least one of:
an edge of the lower surface of the quantum well structure and an edge of an upper surface of the first semiconductor layer; and
an edge of the upper surface of the quantum well structure and an edge of a lower surface of the second semiconductor layer, and wherein a diameter of the current blocking layer is equal to a diameter of the emission layer and larger than a diameter of the conductive layer.

* * * * *